United States Patent [19]

Chu

[11] 4,226,281
[45] Oct. 7, 1980

[54] THERMAL CONDUCTION MODULE

[75] Inventor: Richard C. Chu, Poughkeepsie, N.Y.

[73] Assignee: International Business Machines Corporation, Armonk, N.Y.

[21] Appl. No.: 47,513

[22] Filed: Jun. 11, 1979

[51] Int. Cl.³ .............................................. H01L 23/40
[52] U.S. Cl. ................................ 165/80 A; 165/80 C; 165/185; 357/81; 361/386
[58] Field of Search .................... 165/185, 80 R, 80 B, 165/80 C, 80 A; 357/82, 81; 361/386

[56] References Cited

U.S. PATENT DOCUMENTS

| | | | |
|---|---|---|---|
| 3,128,419 | 4/1964 | Waldkötter et al. | 165/185 |
| 3,387,191 | 6/1968 | Fishman et al. | 357/81 |
| 3,390,717 | 7/1968 | Townsend | 165/185 |
| 3,993,123 | 11/1976 | Chu et al. | 357/82 |
| 4,153,107 | 5/1979 | Antonett et al. | 165/185 |
| 4,156,458 | 5/1979 | Chu et al. | 357/81 |

OTHER PUBLICATIONS

Conduction Cooling, Chu, IBM Tech. Disc. Bull., vol. 21, No. 2, Jul. 1978, pp. 752–753.
Heat Sink, Bryden, IBM Tech. Disc. Bull., vol. 11, No. 10, Mar. 1969, p. 1323.
Conduction Cooling Module with a Variable Resistance Thermal Coupler, IBM Tech. Disc. Bull., vol. 21, No. 6, Nov. 1978, p. 2434, Gupta et al.
Chip Cooling, Krumm, IBM Tech. Disc. Bull., vol. 20, No. 7, Dec. 1977, pp. 2728–2729.

Primary Examiner—Sheldon Richter
Attorney, Agent, or Firm—Harold H. Sweeney, Jr.

[57] ABSTRACT

A matrix of small diameter holes are located in the module housing adjacent each of the integrated circuit chips to be cooled. A pin or rod is located in each of the holes and extends therefrom into contact with the exposed surface of the chip. A spring means is located between the housing and the pin to provide a predetermined spring loading of the pin-piston against the exposed surface of the chip. A header is located at the outer end of the pin-piston in contact with the exposed surface of the chip thereby, providing multiple pin-piston contact with the exposed surface of the chip regardless of the chip tilt which improves the heat transfer. The heat transfer can be controlled by including or removing pin-pistons in accordance with the heat transfer desired.

10 Claims, 7 Drawing Figures

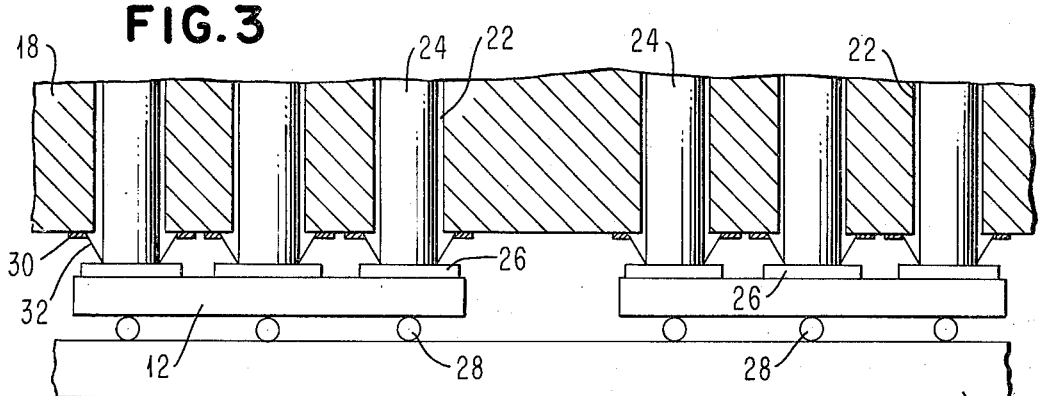
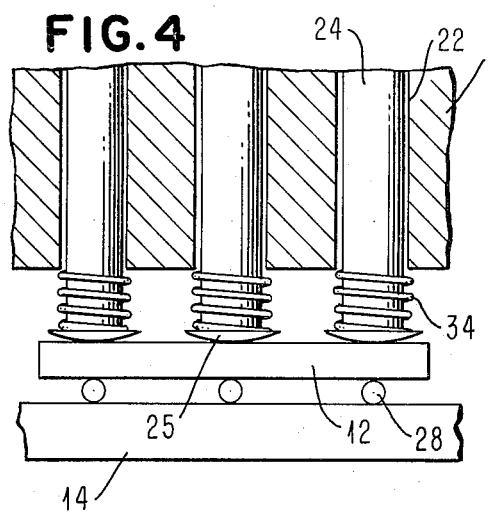
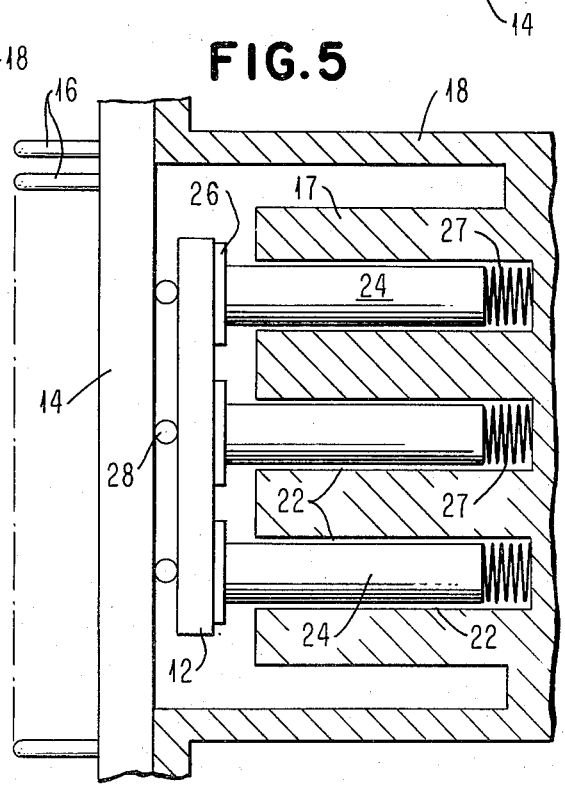
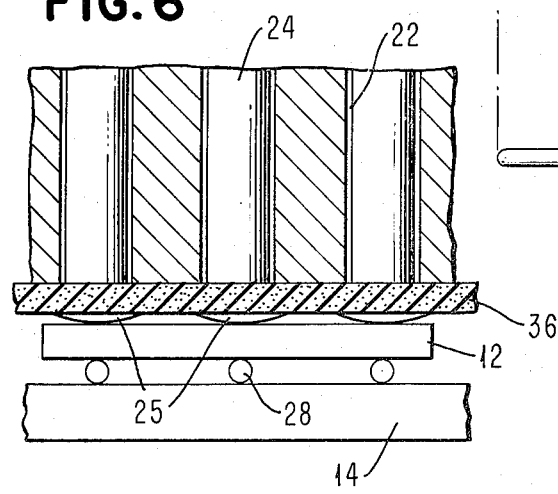

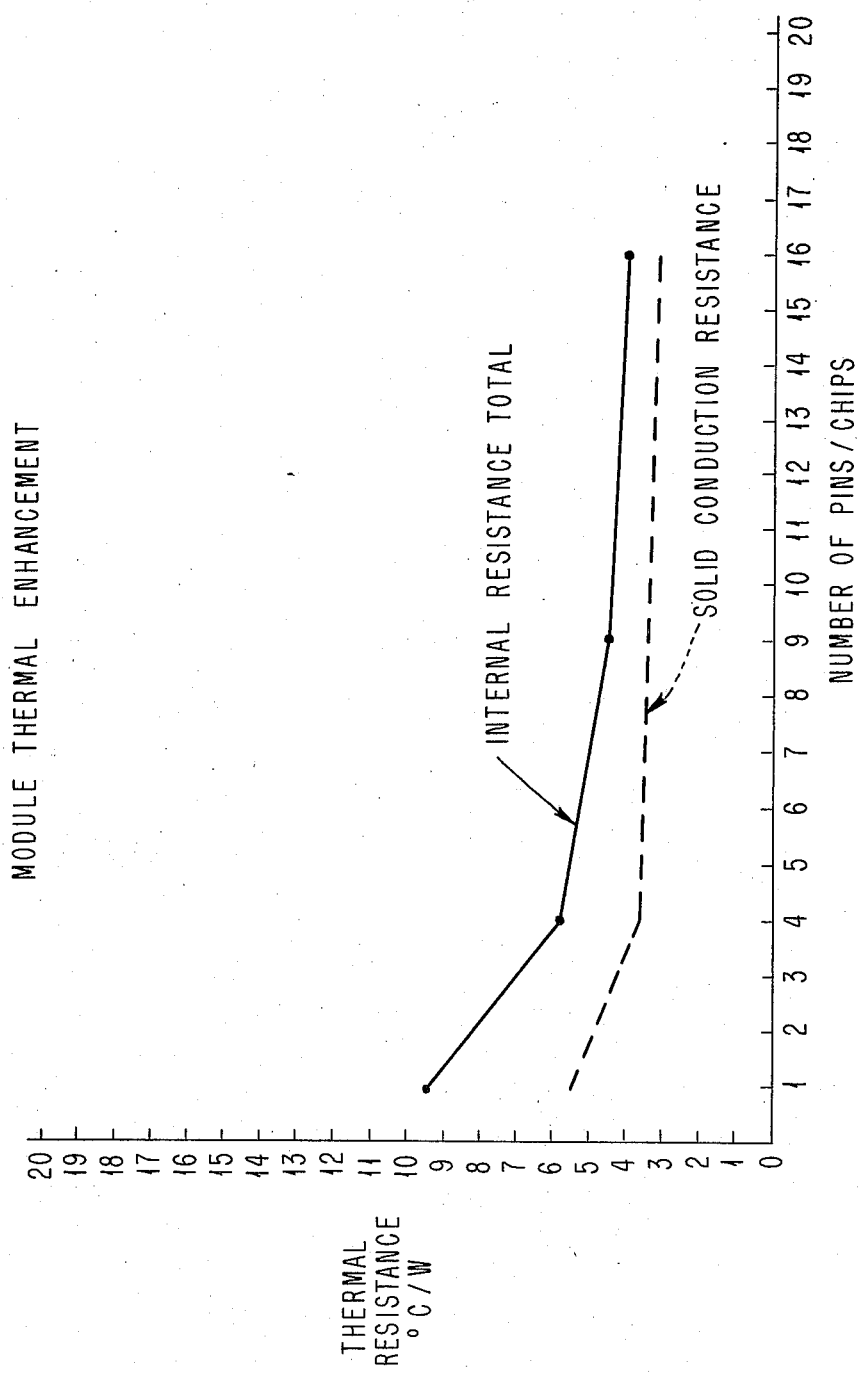

THERMAL CONDUCTION MODULE

TECHNICAL FIELD

The invention relates to a thermal conduction assembly or module for integrated circuit chips and, more particularly, to a thermal conduction module for improving and controlling the heat transfer from reverse mounted integrated circuit chips which may be tilted.

One object of the present invention is to provide a thermal conduction module for improving the thermal conduction from reverse mounted electronic chips that may be tilted.

Another object of the present invention is to maintain a fixed thermal resistance between the electronic chip and the housing irrespective of chip tilt.

Another object of the present invention is to provide a thermal conduction module in which the heat transfer can be easily regulated.

Another object of the present invention is to provide a thermal conduction arrangement within a module which is inexpensive and easy to manufacture.

BACKGROUND ART

With the miniaturized capabilities afforded by the discovery of solid state electronics, various improved means of dissipating the heat generated by solid state components have been investigated. The standard of forced convection means appears to have reached its limit of practicality in that the amount of air that is required to provided sufficient cooling for the limited heat dissipating surfaces introduces a noise problem, and without some auxiliary techniques cannot maintain each of a large number of components within its critical, narrow operating temperature range. Accordingly, especially in connection with large scale computer systems, various innovative cooling systems have been devised. One of the more recent systems investigated has been the gas encapsulated cooling module of U.S. Pat. No. 3,993,123, issued Nov. 23, 1976, wherein an encapsulated cooling unit or module is provided which utilizes inert gas having good thermal conductivity as the encapsulated medium in combination with a conductive heat transfer arrangement. The integrated circuit chips to be cooled in the system are reverse mounted and connected face down to a substrate through solder balls. Because of this type of mounting the chip is often slightly tilted. The tilt provides a poor surface contact between the conductive stud element and the back side of the chip. Accordingly, a high thermal resistance joint is formed which, in the case of the patent, required the insertion of a thermal conductive gas to lower the resistance.

U.S. Pat. No. 4,156,458, issued May 29, 1979, sets forth a heat conductive metal foil bundle of sufficient thickness to contact sufficient surface area of the exposed back side of the chip to provide the required heat transfer, and which is sufficiently thin to be flexible enough to absorb differences in distance between the chip and the heat sink due to tilt as well as to expand and contract due to temperature changes, and which is of sufficient length to connect to the heat sink at or near the other end thereof. Good heat transfer was obtained using this arrangement, however, the large thickness of the bundle often adversely effected the flexibility and, therefore, exceeded the surface force limits established by the solder ball mountings.

SUMMARY OF THE INVENTION

Apparatus is provided which makes a good conduction heat transfer connection between an integrated circuit chip and a heat sink by making a plurality of individual area contacts with the back side of the chip regardless of the chip tilt and maintaining the required force on the chip surface. The apparatus consists of a matrix of pins mounted in a matrix of cylindrical openings in the housing ajacent the chips to be cooled. The pins have headers on the outer end thereof which contact the chip surface. Each pin is spring loaded individually to make individual contact with the chip surface with the required force. It should be appreciated, that each pin makes individual contact with the chip surface under individual spring loading so as to make contact regardless of the chip tilt.

BRIEF DESCRIPTION OF THE DRAWINGS

In the accompanying drawings forming a material part of this disclosure:

FIG. 3 is a blown-up cross-sectional view of two chips and the adjacent housing arrangement of a module showing springs in position to spring load the pins against the chips;

FIG. 4 is a partial cross-sectional view of the module showing pins in the housing loaded against the chip by a helical spring, and showing a crowned head at the outer end of each pin;

FIG. 5 is a partial sectional view of a single chip module showing spring loaded pins pressing against the chip;

FIG. 6 is a partial cross-sectional schematic diagram showing a resilient material providing the required force of the pins against the chip;

FIG. 7 is a graph of the thermal resistance versus the number of pins per chip.

DISCLOSURE OF THE INVENTION

For further comprehension of the invention, and of the objects and advantages thereof, reference will be had to the following description and accompanying drawings, and to the appended claims in which the various novel features of the invention are more particularly set forth.

Figure 1:
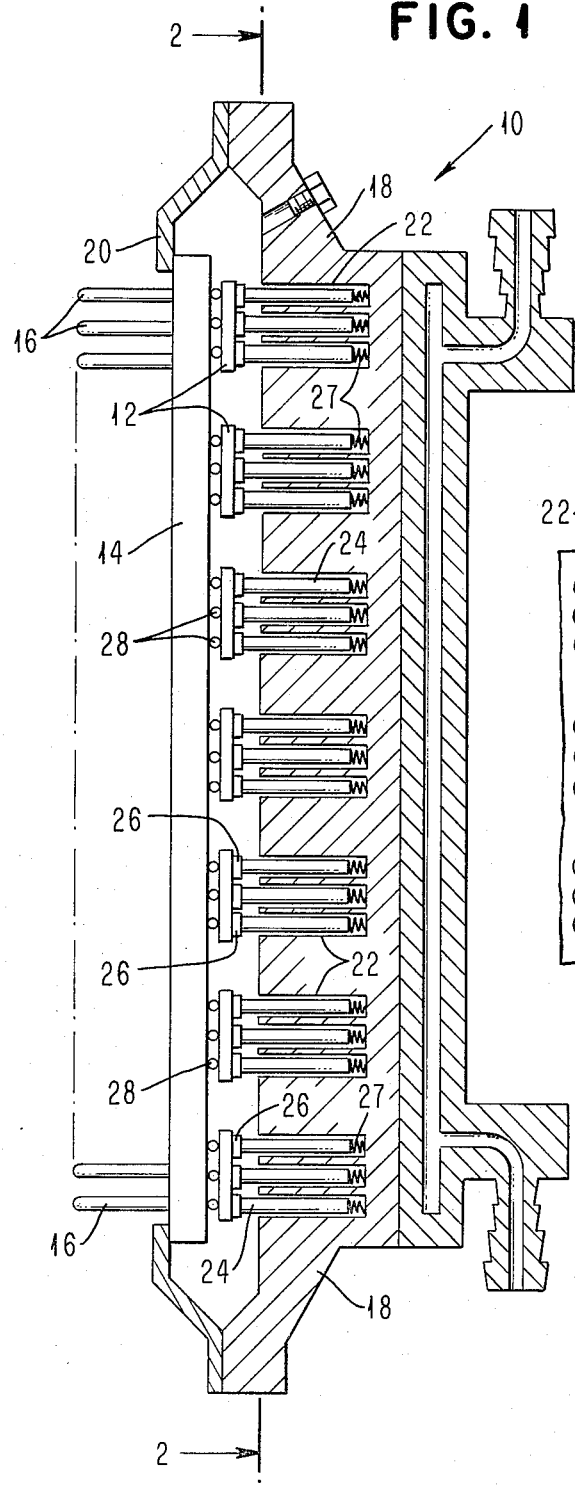
FIG. 1 is a cross-sectional view of a thermal module having a matrix of pins, located in a like matrix of holes in the housing, spring loaded against the chips.

Referring to FIG. 1, there is shown a cross-sectional view of a gas encapsulated thermal conduction module 10 for providing cooling of the integrated circuit chips 12 contained therein. As is well known, the chip consists of solid state circuits and devices which are densely packed thereon. The power consumed in the circuits within the chip generates heat which must be removed from the chip. Since the various circuits have different power requirements, and since the integrated components thereon must be maintained within certain temperature ranges for reliable operation, the cooling must be of such character as to maintain the chip temperature within the required operating range.

Figure 2:
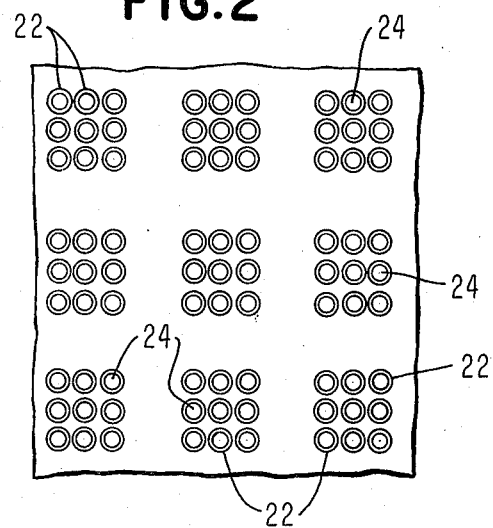
FIG. 2 is a partial section taken along the line 2—2 of FIG. 1 showing the cross-section along the diameter of the pins in the matrix of openings in the housing.

The chips 12 are mounted on one side of a substrate 14, generally made of ceramic, which has pins 16 extending from the other side thereof. These connecting pins 16 provide for the plugging of the module into a board (not shown) which may very well carry auxiliary circuits, etc. A housing or cap 18 is attached to the substrate 14 by means of a flange 20 which extends from the periphery of the substrate 14 to the cap 18. The cap 18 is made of a good heat conductive material such as copper or aluminum. The cap has samll cylindrical openings 22 located therein, which are arranged in a matrix directly adjacent to the exposed surface of each chip 12. FIG. 2 shows a 3 by 3 matrix of openings 22 containing pins 24 opposite each of the chips 12 in the module. These openings 22 have to be of a sufficient depth and diameter of receive a pin-piston 24. Actually, the pin-piston 24 should just fit into the cylindrical opening 22 so that there is no binding, yet the wall of the cylindrical opening 22 is close enough to the pin 24 to form as small a gap as possible. The diameter of the pin 24 is determined by the size of the chip 12 and the number of pins 24 to be included in the matrix. It should be appreciated, that the object is to contact as much of the chip 12 surface as possible with the pins 24. Accordingly, if there are a large number of pins 24 contacting the surface, the diameter thereof will have to be relatively small to be included in the housing adjacent the chip surface. Similarly, if fewer pins 24 are utilized, the diameter can be increased accordingly. The pins 24 are made of a good heat conducting material such as aluminum or copper or alloys thereof.

The same numeral will be utilized to identify the same or similar part throughout the drawings. For example, FIG. 2 is a partial cross-sectional view taken along the line 2—2 of FIG. 1 showing the pins 24 located in a 3 by 3 matrix of openings 22 adjacent the surface to be cooled of each chip 12.

Each of the pin-pistons 24 has a head or header 26 at the end thereof which contacts the chip 12 surface when the pin-piston is inserted in the adjacent opening 22 within the housing 18. As can best be seen in FIG. 3, the header 26 can be square and flat to form a good heat transfer junction between the chip 12 and the header 26 to get the maximum heat transfer from the chip to the header and, consequently, into the pin-piston 24. A spring means 27 is included between the housing 18 and the pin-piston 24 to give a small force of the header 26 against the chip 12 surface. It has been found that a small pressure at the interface between the header 26 and the chip 12 surface provides a better heat transfer junction. The spring 27 pressure cannot be too great since the chips 12 are mounted on solder balls 28 which might tend to change shape under high forces.

The spring force can be obtained by a ring 30 which has two or more leaves 32 extending axially therefrom, as shown in FIG. 3. The ring 30 is slipped onto the pin-piston 24 with the leaves 32 extending towards the header 26 before the pin is inserted into the housing 18. The ring 30 abuts against the bottom of the housing 18 around the outside of the cylindrical opening 22 and the axially extending leaves 32 contact the back of the head 26 to provide the spring force of the pin 24 against the chip 12. Of course, a coil type spring 34 (shown in FIG. 4) can be used, which extends from the bottom of the housing 13 around the opening 22 to the back of the header 25 to provide the required spring force similar to the leaf spring 30, 32 previously described. A spring means 27 such as shown in FIGS. 1 and 5 can also be utilized. This consists of a small spring 27 which is inserted in the cylindrical opening 22 in the housing 18 before the pin 24 is inserted. This type of spring 27 requires the length of the pin 24 and the depth of the opening 22 to be carefully dimensioned such that the spring 27 gives the required force.

FIG. 6 shows a further embodiment of the invention in which the force of the pin-piston 24 against the surface of the chip 12 to be cooled is obtained from a resilient material 36 which is located between the housing 18 and the back of the header 25. The resilient material 36 exerts an equal and opposite force to the squeezing force which adds to the force exerted by the weight of the pin-piston 24 to provide the predetermined small force which improves the heat transfer at the contact points of the pin-piston 24 and the surface of the elements 12 to be cooled. The resilient material 36 can be rubber or similar material. A lightweight material such as sponge is preferable since the weight is negligible. However, if the material is considered to be heavy enough to cause the force tolerated by the element 12 to be cooled to be exceeded, the material can be glued or attached to the bottom of the housing 18.

FIG. 4 shows the head 25 on the pin-piston 24 having a crowned surface contacting the chips 12 rather than the flat surface previously described. It has been found that the slight crowning of the head contacting surface gives a more consistent surface area contact than is the case with a flat surface contact when the chip 12 surface is tilted. There are two problems involved in flat surface contact; one, it is hard to get the surfaces absolutely flat so that the mating surfaces sometimes make only a point contact, that is, contact at the high point of the surfaces. This can give a substantial gap which interferes with the heat transfer. Secondly, the chips 12 are often tilted slightly such that the flat surface of the head only meets with the tilted surface of the chip at a point or at most a line contact. The crowning of the head 25 gives a fixed surface area contact pretty such independent of the tilt of the chip 12.

The heat transfer obtained using the plurality of pin-pistons 24 making multiple contact points with the chip 12 surface provides an improved heat transfer over the prior art. The prior art uses a single large diameter stud or piston which contacts the chip surface. It should be appreciated that the flat stud surface contacting the tilted chip surface would give a very poor heat transfer gap. The prior art has solved this problem by including helium gas within the module which tends to seep into the interface and improve the heat transfer therein. The multiple point contact arrangement lowers the thermal resistance sufficiently to provide an overall heat transfer from the module equivalent to the heat transfer from the prior art module using the helium gas. The multipoint contact module 10 can be further enhanced by including helium gas therein, which lowers the resistance of the gaps existing between the pin-piston headers and the chip 12 and also the interface between the pin-pistons 24 and the housing cylindrical opening 22 walls. The gas is a good thermal conductor and is also inert. By inert, it is meant that the gas is electrically non-conductive, non-poisonous, non-corrosive, non-flamable, non-explosive and non-toxic. The gas also has a high adhesion quality that essentially wets the surface which it is in contact with. Other low molecular weight gases such as hydrogen or carbon dioxide could be used. Other fluids could also be utilized such as thermal grease or even a dielectric liquid. Rather than have the whole interior of the module filled with a fluid such as grease, the cylindrical gaps between the pins 24 and the cylindrical opening 22 walls could be filled with the fluid and the wetting of the walls and surface tension thereof would tend to hold the fluid in the interface.

A single chip, encapsulated, conductive cooling unit is shown in FIG. 5. The chip 12 is shown mounted on a substrate 14 which has the pins 16 extending from the opposite side thereof for plugging the unit onto a board (not shown). A cap or container 18 is sealed to the substrate 14 enclosing the chip 12. The cap 18 has a central extension 17 which extends from the top of the cap towards the chip. The extension 17 has a plurality of cylindrical openings 22 therein which extend from the end of the extension nearest the chip 12 toward the wall of the cap. A resilient member 27 is located at the bottom of the cylindrical opening 22. The pin-pistons 24 are shown within the cylindrical openings 22 and pressed against the resilient member 27. The pin-pistons 24, when in place in the cylindrical openings 22, abut the chip 12 at a multiple of points depending on the number of pins 24. The remaining open areas within the cap 18 can be evacuated and a fluid such as helium gas or thermal grease can be placed therein. As previously mentioned, the cylindrical gap between the pin-pistons 24 and opening walls in the cap 18 extension 17 could be filled with grease and the grease maintained within these cylindrical openings. If the module cap 18 surfaces do not prove sufficient for removing the heat generated by the single chip 12, fins or a small cold plate can be easily attached thereto.

Some dimensions for a 3 by 3 matrix arrangement of pin-pistons is included to give a better idea of the sizes involved. The chip is selected to be 0.46 cm square with a 0.64 cm long 0.127 cm diameter pin-piston. The diameter of the opening in the housing in which the pin-piston fits is approximately 0.130 cm thus giving a 0.003 cm gap between the pin and the cylindrical wall of the housing.

FIG. 7 shows a plot of the thermal resistance versus the number of pins 24 per chip. The dashed line curve represents the fixed resistances of the pin-pistons and the housing or cap. The solid line curve represents the internal resistance which is the resistance from the chip or element to be cooled to the outside surface of the housing. The difference in resistance represented between the dashed line plot and the solid line plot represents the resistance added by the two interfaces, that is the interface between the chip 12 and the pin-piston 24 and the interface between the pin-piston 24 and the cylindrical walls of the opening 22 in the housing 18. It should be noted from the solid line plot, that the resistance does not diminish much after the nine pin point. That is, adding more pins seems to have little affect on the resistance.

It should be noted that the cooling for a particular chip 12 in the module 10 can be customized by selecting various combinations of materials and parts. For example, an aluminum pin-piston 24 will give less heat transfer than a copper pin. For a low power chip preselected ones of the pin-pistons can be left out. If a portion of the chip has no power being consumed therein and, therefore, no heat being generated, the pins 24 can be left out of that area completely. It is also possible to combine pins 24 with thermal grease or with helium gas, etc., to enhance the heat transfer for the particular module.

While we have illustrated and described preferred embodiments of my invention, it is to be understood that I do not limit myself to the precise construction herein disclosed and the right is reserved to all changes and modifications coming within the scope of the invention as defined in the appended claims.

Having thus described my invention, what I claim as new, and desire to secure by Letters Patent is:

1. In a thermal conduction module for providing cooling of one or more integrated circuit chips having an exposed surface comprising:
    a housing having a surface adjacent the exposed surface of said circuit chips;
    a plurality of cylindrical openings adjacent each chip extending into said housing from the surface facing said circuit chips;
    a plurality of pin-pistons, one located in each of said plurality of cylindrical openings adjacent each chip and extending therefrom into contact with the exposed surface of said circuit chip;
    a spring means located between said housing and each of said pin-pistons to provide a predetermined spring loading force of said pin-piston against the exposed chip surface; and
    header means located at the outer end of each of said pin-pistons in contact with the exposed chip surface;
    said pin-pistons contacting the exposed chip surface even when the chip is tilted thereby providing improved heat transfer.

2. In a thermal conduction module according to claim 1, wherein said plurality of cylindrical openings extend sufficiently far into said housing so that the spring loaded pin-piston does not abut the opening inner end surface when engaged by said spring means.

3. In a thermal conduction module according to claim 1, wherein said plurality of cylindrical openings are of a large enough diameter and said pin-pistons are of a small enough diameter to fit into said cylindrical openings with a minimum pin-piston cylindrical opening wall gap.

4. In a thermal conduction module according to claim 1, wherein said housing and said pin-pistons are made of a good heat conducting material such as copper or aluminum.

5. In a thermal conduction module according to claim 1, wherein said spring means is a coil spring having one end mounted against the back side of said header means and the other end bearing against said housing when said exposed chip surface is contacted by the end of said pin-piston.

6. In a thermal conduction module according to claim 1, wherein said spring means comprises a plurality of leaf springs having sufficient resiliency to apply the desired force of said pin-piston against said chip surface when located lengthwise between the back of said header and said housing.

7. In a thermal conduction module according to claim 1, wherein said cylindrical openings are located in a matrix within said housing opposite each of said chips such that said pin-pistons when mounted therein contact said chip surface at evenly spaced positions over the entire chip surface.

8. In a thermal conduction module according to claim 1, wherein said header means is a flat square head at the end of and orthogonal to said pin-piston longitudinal center line, said head covering the maximum area of said exposed surface of said chip limited by the density of said pin-pistons.

9. In a thermal conduction module according to claim 1, wherein said header means comprises a head at the end of said pin-piston having a crowned outer surface to give the same area contact of said head with said chip exposed surface regardless of chip tilt.

10. In a thermal conduction module according to claim 1, wherein preselected pin-pistons are not included in said cylindrical openings thereby providing a control means for the amount of cooling.

* * * * *